(12) United States Patent
Bult (10) Patent No.: US 6,204,794 B1
(45) Date of Patent: Mar. 20, 2001

(54) ANALOG TO DIGITAL CONVERTER

(75) Inventor: Klaas Bult, Dana Point, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/580,307

(22) Filed: May 26, 2000

Related U.S. Application Data (63) Continuation of application No. 09/189,096, filed on Nov. 9, 1998, now Pat. No. 6,100,836, which is a continuation of application No. 08/792,941, filed on Jan. 22, 1997, now Pat. No. 5,835,048.

(51) Int. Cl.$^7$ .................................................. H03M 1/12
(52) U.S. Cl. ............................................ 341/155; 341/156
(58) Field of Search ................................... 341/159, 118, 341/120, 121, 158, 160, 154

(56) References Cited

U.S. PATENT DOCUMENTS

| | | | | |
|---|---|---|---|---|
| 4,058,806 | * | 11/1977 | Nadler | 340/347 AD |
| 5,157,397 | * | 10/1992 | Vernon | 341/157 |
| 5,175,550 | * | 12/1992 | Kattmann et al. | 341/159 |
| 5,416,485 | * | 5/1995 | Lee | 341/172 |
| 5,675,341 | * | 10/1997 | Vallencourt et al. | 341/158 |
| 5,835,048 | * | 11/1998 | Bult | 341/159 |
| 6,100,836 | * | 8/2000 | Bult | 341/155 |

\* cited by examiner

*Primary Examiner*—Brian Young
(74) *Attorney, Agent, or Firm*—Christie, Parker & Hale, LLP (57) ABSTRACT

An analog-to-digital converter (ADC) formed on an integrated circuit chip from a plurality of cells includes a differential amplifier having first and second branches. The branches in each cell respectively have first and second transistors respectively responsive to an input voltage and an individual one of progressive fractions of a reference voltage. The relative outputs from the branches for each cell are dependent upon the relative values of the two voltages introduced to the cell. To minimize cell mismatches and the effects of these mismatches on cell outputs, first and second sets of averaging impedances, preferably resistors, are respectively connected between the output terminals of the first branch transistors, and between the output terminals of the second branch transistors, in successive pairs of cells. Current sources connected to the output terminals of the transistors in the first and second branches have characteristics (preferably impedances approaching infinity) to force the load bearing currents from the transistors to flow through the impedances in the first and second sets. The impedances have relatively low values, particularly in comparison to the impedances of the current sources, to reduce cell mismatches. First and second resistive strips on the chip may be tapped at progressive positions to respectively define the impedances in the first and second sets. One end of each strip may be connected to the opposite end of the other strip to define a closed impedance loop to minimize averaging errors at the ends of the strip.

17 Claims, 6 Drawing Sheets

ANALOG TO DIGITAL CONVERTER

CROSS REFERENCE TO RELATED APPLICATIONS

This application is a continuation of allowed application Ser. No. 09/189,096 filed Nov. 9, 1998, now U.S. Pat. No. 6,100,836, which is a continuation of application Ser. No. 08/792,941 filed Jan. 22, 1997 from which issued U.S. Pat. No. 5,835,048 dated Nov. 10, 1998, the disclosures of which are incorporated fully herein by reference.

This invention relates to integrated circuits in which repetitive cells are matched for optimal circuit operation. More particularly, this invention relates to integrated circuits in which the effects of any cell mismatches are minimized. The invention is particularly adapted to be used in analog-to-digital converters. The invention additionally relates to methods of minimizing the effects of cell mismatches in the outputs of the cells.

BACKGROUND OF THE INVENTION

Various types of systems have been provided in the prior art for converting an analog voltage to digital signals (currents or voltages) representative of such analog voltage. One type of system often used in the prior art to provide such conversion has been known as a "flash converter". In a flash converter, an analog input signal representative of the analog value to be converted digitally is introduced to a first input of a differential amplifier in each of a plurality of repetitive cells. An individual one of a plurality of progressive fractions in a reference voltage is introduced to a second input of such differential amplifier.

In the prior art, the differential amplifier in each cell may have first and second branches each including a transistor such as a CMOS transistor and each having a gate, a source and a drain. The gates of the transistors in the first and second branches respectively receive the first and second inputs. The drains of the two (2) transistors in each differential amplifier have a common connection to a source of a substantially constant current.

Load bearing currents flow through the transistors in the branches in each differential amplifier in accordance with the relative values of the voltages on the gates of the transistors, the sum of these currents being the substantially constant current. Thus, a first output such as a binary "1" is produced in the differential amplifier when the input voltage exceeds the reference voltage introduced to the differential amplifier. Similarly, a second output such as a binary "0" is produced in the differential amplifier when the input voltage is less than the reference voltage introduced to the differential amplifier.

In the prior art, a plurality of comparators are provided each comparing the outputs in an individual pair of successive differential amplifiers. The analog input voltage is determined by the comparator in which opposite output voltages are produced from the differential amplifiers providing inputs to the comparator. Each comparator is programmed to provide a series of digital signals indicative of the individual one of the progressive fractions of the reference voltage introduced to one of the differential amplifiers providing inputs to the comparator.

The analog-to-digital converter discussed above is advantageous in that it can operate at high frequencies such as in the megahertz range. However, in order to determine the value of the input voltage with some accuracy and to convert this input voltage to the corresponding digital signals, a large number of amplifiers have to be provided. For example, for a converter providing a conversion of an analog signal to ten (10) binary bits, ten hundred and twenty four (1024) differential amplifiers and ten hundred and twenty three (1023) comparators would be required. When the input voltage is approximately two volts, each amplifier would have to provide a distinction between adjacent amplifiers in the order of two millivolts (2 mV.) Since this voltage is relatively small, it presents difficulties in the operation of the comparators.

The flash types of analog-to-digital converters have generally been disposed on an integrated circuit chip, particularly for a number of binary bits greater than about seven (7). Imperfections in the silicon substrate of the chip and in the methods of manufacturing the chip have produced mismatches between successive pairs of differential amplifiers. These mismatches have caused errors to be produced in the stages providing the comparison between successive pairs of differential amplifiers. These mismatches have caused errors to be produced in digital indications produced to represent the analog input signal.

Various attempts have been made to compensate for the cell mismatches produced in the converter of the prior art. For example, U.S. Pat. No. 5,175,550 issued to Kevin M. Rattman and Jeffrey G. Barrow for "Repetitive Cell Matching Technique for Integrated Circuits" and assigned of record to Analog Devices, Inc. discloses a system for, and method of providing, such compensation. In the '550 patent, a plurality of cells are provided each including a differential amplifier defined by two (2) branches. A transistor is provided in each branch. The transistor in a first one of the branches in each cell receives an input signal and the transistor in a second one of the branches in each cell receives an individual one of the progressive fractions of a reference voltage.

In the '550 patent, a plurality of load resistors are provided each connected to an individual one of the transistors in one of the first and second branches in an individual one of the cells to receive the load current flowing through such transistor. In addition, a first plurality of averaging resistors is provided each connected between the corresponding output terminals of the transistors in the first branches of successive pairs of the repetitive cells. A second plurality of averaging resistors is also provided each connected between the corresponding output terminals of the transistors in the second branches of successive pairs of the repetitive cells.

The system disclosed in the '550 patent operates to average the cell mismatches over a plurality of cells so as to reduce the inaccuracies resulting in the converted digital signals from the cell mismatches. Because of this, the system disclosed in the '550 patent reduces the differential non-linearities and integral non-linearities in the analog-to-digital converter formed from the plurality of cells. The lower the values of the averaging resistors that are provided in the first and second pluralities in the '550 patent, the greater is the improvement in the accuracy of the conversion from the analog value to the digital value. For example, in the optimum, the differential non-linearity of the system disclosed in the '550 patent is reduced by a factor of approximately three (3) (1.58 bits) in comparison to the A-D converters of the prior art.

BRIEF DESCRIPTION OF THE INVENTION

Although the system disclosed in the '550 patent provides a significant improvement in the accuracy of the digital output signals over the prior art, this improvement is small compared to the improvement produced by the system of this invention in the accuracy of the output digital signals. For example, the system of this invention provides an improvement of the differential non-linearity in the accuracy of the output digital signals by as much as 17.3 (4 bits) when averaging over sixteen (16) stages. The system of this invention additionally averages currents from approximately sixteen (16) stages and produces an approximately two (2) binary bit gain in integral non-linearity.

In one embodiment of the invention, an analog-to-digital converter (ADC) formed on an integrated circuit chip from a plurality of cells includes a differential amplifier having first and second branches. The branches in each cell respectively have first and second transistors respectively responsive to an input voltage and an individual one of progressive fractions of a reference voltage. The relative outputs from the branches for each cell are dependent upon the relative values of the two voltages introduced to the cell.

To minimize cell mismatches and the effects of these mismatches on cell outputs, first and second sets of averaging impedances, preferably resistors, are respectively connected between the output terminals of the first branch transistors, and between the output terminals of the second branch transistors, in successive pairs of cells.

Current sources connected to the output terminals of the transistors in the first and second branches have characteristics (preferably impedances approaching infinity) to force the currents from the transistors to flow through the impedances in the first and second sets. The impedances have relatively low values, particularly in comparison to the impedances in the current sources, to reduce cell mismatches.

First and second resistive strips on the chip may be tapped at progressive positions to respectively define the impedances in the first and second sets. One end of each strip may be connected to the opposite end of the other strip to define a closed impedance loop and to minimize averaging errors at the ends of the strip.

The system disclosed and claimed in this application has certain important advantages over the prior art including the system of the '550 patent. These advantages provide the considerable improvements in differential non-linearity and integral non-linearity specified above. These considerable improvements result in part from the fact that the system of this invention uses current sources (of a very high impedance value) as load elements whereas the '550 patent uses resistors.

The considerable improvements in the embodiment of this invention also result from the fact that the averaging impedances in the system of this invention constitute the actual signal current carrying load elements. Furthermore, in the system of this invention, applicant provides a circular (or looped) termination of the averaging impedances. Furthermore, in the '550 patent, the last resistors in the first and second pluralities are terminated on an open ended basis.

Although the system of this invention is disclosed for use in an analog-to-digital converter, it has utility in other systems as well. For example, the system of this invention may be used in a digital-to-analog converter. Actually, the system of this application may be used in any embodiment where a plurality of repetitive cells are provided, particularly when the repetitive cells are disposed on an integrated circuit chip.

DETAILED DESCRIPTION OF THE INVENTION

Figure 1:
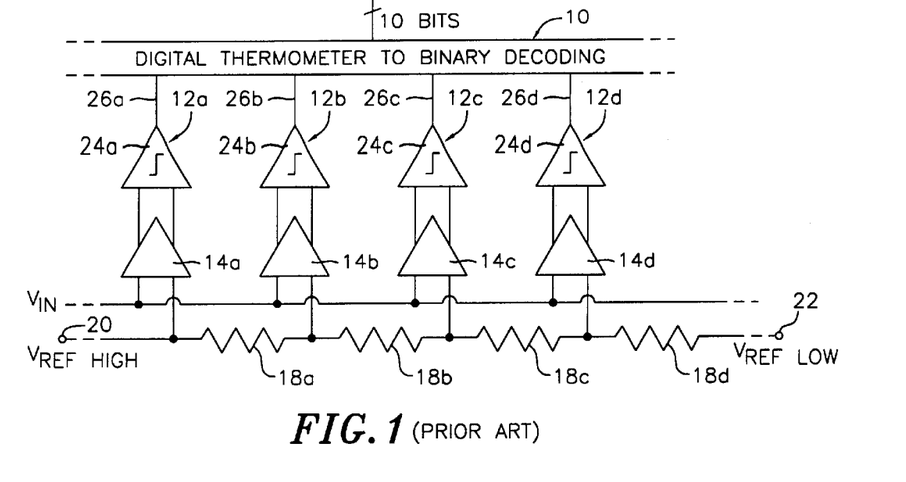
FIG. 1 is a simplified circuit diagram of a conventional flash converter of the prior art.

FIG. 1 illustrates on a schematic basis an analog-to-digital (A-D) converter, generally indicated at 10, of the prior art. The A-D converter is of the type known as a flash converter. It includes a plurality of cells generally indicated at 12a, 12b, 12c and 12d. Although only four (4) cells are shown, it will be appreciated that the four (4) cells are representative of a number of cells which may be considerably greater than four (4). For example, 1024 cells may be employed to provide a conversion of an analog input voltage to ten (10) binary bits.

Each of the cells 12a, 12b, 12c and 12d includes an individual one of a plurality of pre-amplifiers 14a, 14b, 14c and 14d. Preferably each of these pre-amplifiers is differential so that it has two (2) inputs and two (2) outputs. One of the inputs to each of the pre-amplifiers 14a, 14b, 14c and 14d receives an analog input signal on a line 16. The other of the inputs to the pre-amplifiers 14a, 14b, 14c and 14d receives an individual one of progressive fractions of a reference voltage. The progressive fractions of the reference voltage are provided by progressive resistors 18a, 18b, 18c and 18d connected in a ladder network between a terminal 20 providing a reference voltage (e.g. 2 volts) and a terminal 22 providing a low potential such as ground.

Each of the pre-amplifiers 14a, 14b, 14c and 14d has two (2) outputs depending upon the relative values of the two (2) voltages introduced to the pre-amplifier. The two outputs from each of the pre-amplifiers 14a, 14b, 14c and 14d are respectively introduced to input terminals of comparators 24a, 24b, 24c and 24d. Output signals are respectively provided on output lines 26a, 26b, 26c and 26d from the amplifiers 24a, 24b, 24c and 24d. The amplifiers 24a, 24b, 24c and 24d are respectively included in the cells 12a, 12b, 12c and 12d.

Each of the pre-amplifiers 14a, 14b, 14c and 14d provides a pair of relative outputs dependent upon the magnitude of the input voltage on the line 16 relative to the magnitude of the particular fraction of the reference voltage introduced to such pre-amplifier. For example, the pre-amplifier 14b produces a higher voltage on the left output line than on the right output line when the input voltage on the line 16 exceeds the particular fraction of the reference voltage introduced to the pre-amplifier. Similarly, the pre-amplifier 14b produces a lower voltage on the left output line than on the right output line when the input voltage on the line 16 is less than the particular fraction of the reference voltage introduced to the pre-amplifier.

The differential outputs from each of the pre-amplifiers 14a, 14b, 14c and 14d respectively cause output voltages to be produced by the comparators 24a, 24b, 24c and 24d. The output voltage from each of the comparators 24a, 24b, 24c and 24d may be a binary "1" or a binary "0". For example, the output from the comparator 24b may be a binary "1" when the magnitude of the input voltage introduced to the pre-amplifier 14b exceeds the magnitude of the particular fraction of the reference voltage introduced to such pre-amplifier. Similarly, the output from the comparator 24b may be a binary "0" when the magnitude of the input voltage introduced to the pre-amplifier 14b is less than the magnitude of the particular fraction of the reference voltage introduced to such pre-amplifier.

It is well known in the art that the binary values of the outputs from successive pairs of the comparators 24a, 24b, 24c and 24d are processed in such stages as exclusive "or" networks to determine the digital equivalent of the analog input on the line 16. The particular exclusive "or" network receiving a binary "0" on one input and a binary "0" on the other input provides an indication of the binary signals representative of the analog input on the line 16.

Mismatches may occur for a number of reasons between successive pairs of the cells 12a, 12b, 12c and 12d. For example, such mismatches may occur because of deviations at different positions on the substrate in the characteristics of the substrate on which the cells are formed. Such mismatches may also occur as a result of deviations in the characteristics of a deposition at different positions on the substrates. Such cell mismatches may cause inaccurate digital indications representative of the analog input to be produced. These inaccurate indications may particularly result from the fact that 1023 comparisons have to be provided to obtain binary indications with an accuracy of ten (10) binary bits. When the reference voltage has a value such as approximately two volts (2 V.), each progressive fraction of the reference voltage has a value of less than two millivolts (2 mV.). As will be appreciated, a cell mismatch does not have to be very large to produce an error in the binary indications representative of the analog input on the line 16, particularly when the difference between the voltages in successive cells is less than two millivolts (2 mv).

Figure 2:
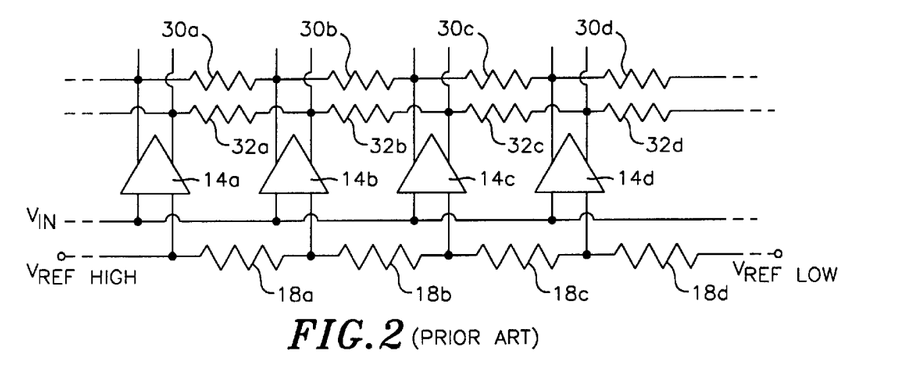
FIG. 2 is a generalized circuit diagram of an integrated circuit employing, in the prior art as shown in the '550 patent, a plurality of respective cells and averaging impedances for reducing the effects of cell mismatches.

FIG. 2 provides an improved flash converter of the prior art to minimize errors resulting from cell mismatches. This improved flash converter may be considered to correspond to FIG. 2 of the '550 patent. The embodiment shown in FIG. 2 includes components corresponding to components shown in FIG. 1. These components have the same numerical designations as the corresponding components shown in FIG. 1. The embodiment shown in FIG. 2 also includes a first set of averaging impedances 30a, 30b, 30c and 30d and a second set of averaging impedances 32a, 32b, 32c and 32d.

Preferably the impedances 30a, 30b, 30c and 30d and the impedances 32a, 32b, 32c and 32d are resistors. The impedances 30a–30d and the impedances 32a–32d preferably have substantially equal values. However, the impedances 30a–30d and 32a–32d may have any desired pattern of values other than the equal values specified above. The impedances 30a–30d are respectively connected to corresponding (e.g. the left) output terminals in successive pairs of the differential pre-amplifiers 24a–24d. Similarly, the impedances 32a–32d are respectively connected to corresponding (e.g. the right) output terminals in the successive pairs of the pre-amplifiers 24a–24d.

Figure 3:
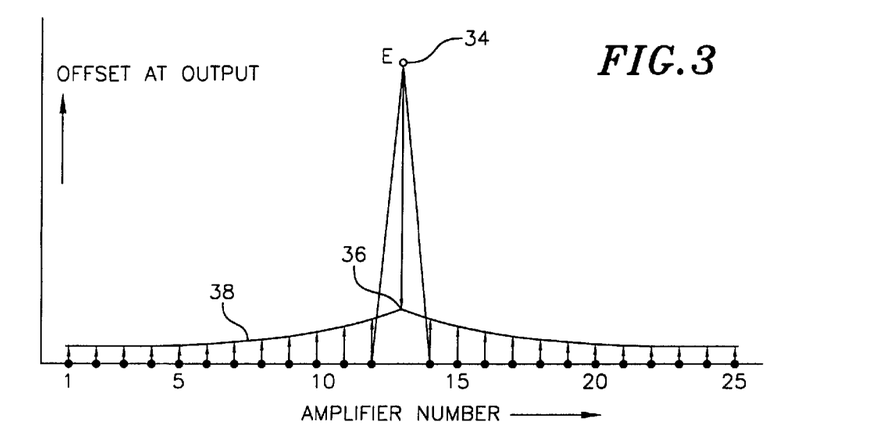
FIG. 3 is a diagram indicating the reducing effect produced on a cell mismatch in a single cell by the electrical circuitry of the prior art as shown in FIG. 2.

FIG. 3 illustrates an offset 34 from a desired voltage when a cell mismatch occurs in the prior art embodiment shown in FIG. 1. As will be seen, this offset occurs illustratively at cell 13 in a string of 25 cells. All of the other cells (1–12 and 14–25) do not have any offset in this example. FIG. 3 also illustrates the offset produced at the cell 13 when the averaging impedances 30a–30d and 32a–32d are included as shown in FIG. 2.

As will be seen in FIG. 3, an offset 36 is produced at the cell 13 when a cell mismatch occurs at the cell 13 in the embodiment shown in FIG. 2. Offsets of progressively decreasing values are produced for each of the cells from cell 12 to cell 1 and from cell 14 to cell 25 in the embodiment shown in FIG. 2. This may be seen from the shape of an envelope 38 in FIG. 3. The envelope 38 in FIG. 3 is advantageous because it considerably reduces the offset at cell 13 and because it considerably reduces the differential non-linearity between successive pairs of the cells. This may be seen in the gradual decrease of the values of the offsets between successive pairs of the cells 13–1 and the cells 13–25.

The impedances 30a–30d and 32a–32d provide reductions in the offset voltage as shown in FIG. 3 by passing a current from the cell producing the offset voltage to the outputs of successive ones of the adjacent cells in the set. For example, an offset voltage at the cell 12b in FIG. 2 will cause a current to pass from this cell and through the impedances 30a and 32a to the outputs of the pre-amplifier 14a in the cell 12a and through the impedances 30b and 32b and the impedances 30c and 32c to the outputs of the respective ones of the pre-amplifiers 14c and 14d in the cells 12c and 12d. The offset voltage progressively decreases for the cells progressively displaced from the cell (e.g. cell 13 in FIG. 3) producing the offset because the offset current progressively decreases in relation to the displacement of the cells from the cell producing the offset. Furthermore, the reduction provided in the offset (e.g. from the offset 34 to the offset 36 in FIG. 3) is dependent upon the values of the impedances 30a–30d and 32a–32d. The reduction provided in the offset is increased with decreases in the values of the impedances 30a–30d and 32a–32d because the averaging currents through the impedances are increased with decreases in the values of these impedances.

Figure 4:
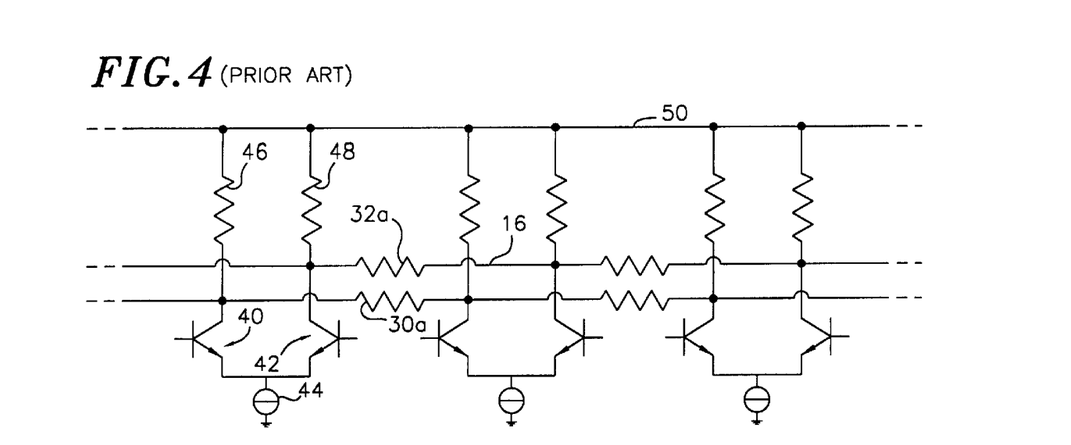
FIG. 4 is a simplified circuit diagram of a flash converter of the type shown in the '550 patent.

FIG. 4 shows an embodiment of the prior art corresponding to that shown in FIG. 2 of the '550 patent. The embodiment shown in FIG. 4 shows the construction of the cells 12a, 12b, 12c and 12d, and particularly the construction of the pre-amplifiers 14a–14d, in additional detail since it includes transistors. The construction of each of the cells 12a–12d is substantially identical. Because of this, only the construction of the pre-amplifier 14a in the cell 12a will be described in detail.

The pre-amplifier 14a in the cell 12a includes a pair of transistors 40 and 42, preferably CMOS and preferably n-type, having their sources connected to one terminal of a source 44 of a substantially constant current. The second terminal of the source 44 is at a reference potential such as ground. The gates of the transistors 40 and 42 respectively receive the voltage on the input line 16 and the voltage at the left terminal of the reference resistor 18a in FIG. 2. The drains of the transistors 40 and 42 respectively are common with first terminals of resistors 46 and 48. The second terminals of the resistors 46 and 48 receive a positive voltage on a line 50. Connections are also made from the drains of the transistors 40 and 42 to the terminals of the averaging impedances 30a and 32a also shown in FIG. 2.

Since the current through the source 44 is substantially constant, this current is divided between the transistors 40 and 42 dependent upon the relative magnitudes of the voltages on the gates of the transistors. Some of the currents through the transistors 40 and 42 respectively flow through the averaging impedances (e.g. resistors) 30a and 30b. However, some of the currents through the transistors 40 and 42 also respectively flow through the resistors 46 and 48. Thus, not all of the currents flowing through the transistors 40 and 42 flow respectively through the averaging impedances 30a and 30b since a significant portion of such currents respectively flow through the resistors 46 and 48. Since the averaging impedances 30a and 30b receive only a portion of the currents flowing through the transistors 40 and 42, they have only a limited effectiveness in reducing the effects of cell mismatches. This is one of the major disadvantages in the system disclosed and claimed in the '550 patent.

Figure 5:
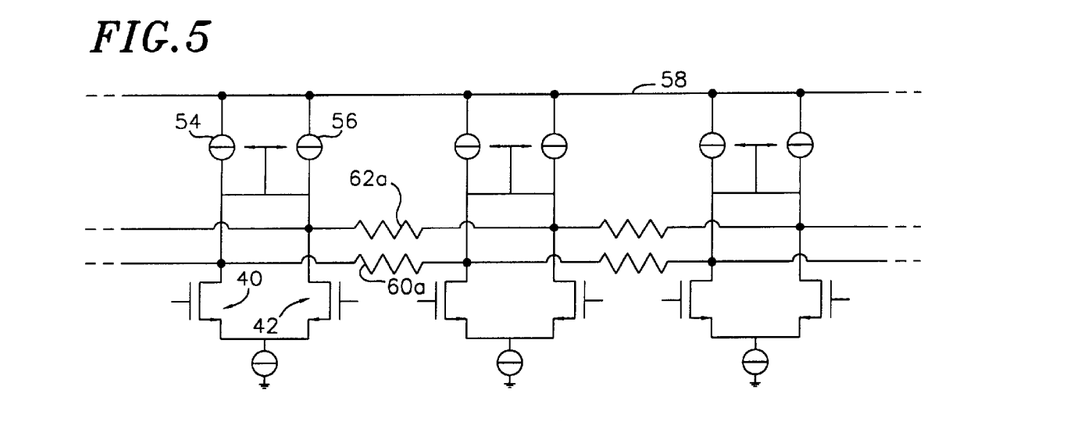
FIG. 5 is a simplified diagram of a flash converter constituting one embodiment of the invention.

FIG. 5 illustrates one embodiment of the invention. In this embodiment, components common to FIGS. 4 and 5 have the same numerical designation. These include the transistors 40 and 42 and the source 44 of substantially constant current. However, the embodiment shown in FIG. 5 includes a pair of current sources 54 and 56 each having an impedance approaching infinity. These current sources are respectively connected between a voltage source 58 and the drains of the transistors 40 and 42. The embodiment shown in FIG. 5 also includes a pair of averaging impedances (e.g. resistors) 60a and 62a respectively connected to the drains of the transistors 40 and 42. The averaging impedances 60a and 60b are given identifications different from the identifications of the corresponding impedances in FIG. 4 because they may have lower values than the corresponding impedances in FIG. 4. It will be appreciated that the other cells in FIG. 5 may have a construction corresponding to that specified above for the cell described in this paragraph.

Because of the impedance values approaching infinity in the impedances 54 and 56, little, if any, signal current flows through these impedances. Therefore, all of the signal current flowing in the transistor 40 flows through the averaging impedance 60a and all of the signal current flowing in the transistor 42 flows through the averaging impedance 62a. The increased currents flowing from the transistors 40 and 42 through the averaging impedances 60a and 62b allow these averaging impedances to have reduced values relative to the values of the averaging impedances 30a and 32a in the prior art embodiment shown in FIG. 4. The increased currents through the averaging impedances 60a and 62a provide for an increased reduction by the embodiment of FIG. 5 in the effects of cell mismatches on the output at the drains of the transistors 40 and 42.

Figure 6:
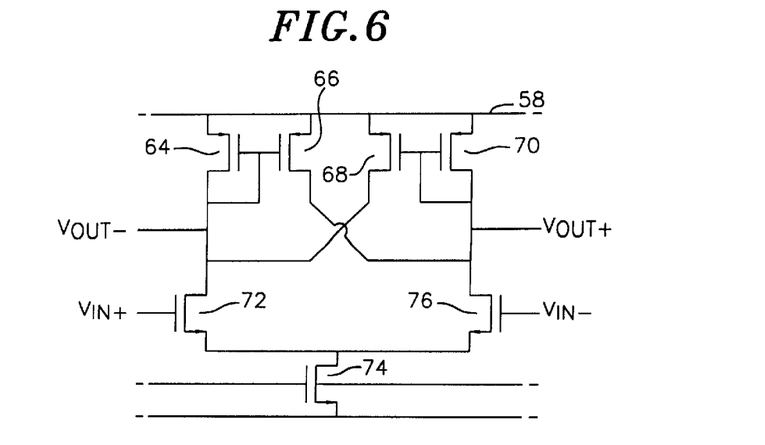
FIG. 6 is a simplified circuit diagram of an amplifier which may be included in the system shown in FIG. 5 to provide high impedance values approaching infinity.

FIG. 6 shows an embodiment of the current sources 54 and 56 providing impedances approaching infinity. The embodiment shown in FIG. 6 includes a first pair of transistors 64 and 66 and a second pair of transistors 68 and 70. The transistors 64, 66, 68 and 70 are preferably CMOS transistors of the p-type. The sources of the transistors 64, 66, 68 and 70 are respectively common with the voltage source 58. The gates of the transistors 64 and 66 have a common connection with the drains of the transistors 64 and 68 and with the drain of a transistor 72. The gate of the transistor 72 may receive a positive input voltage. The transistor 72 may be a CMOS transistor of the n-type.

The source of the transistor 72 may have common connections with the drain of a transistor 74 and with the source of a transistor 76. The transistors 74 and 76 may be CMOS transistors of the n-type. The gate of the transistor 76 may receive a negative voltage relative to the voltage on the gate of the transistor 72. The drain of the transistor 76 is common with the drains of the transistors 66 and 70 and with the gates of the transistors 68 and 70.

The positive voltage on the gate of the transistor 72 causes the transistor to conduct current and to produce a relatively low voltage on the gates of the transistors 64 and 66. This causes the transistor 64 to conduct current and to produce a high voltage on the drain of the transistor. In like manner, the low voltage on the gate of the transistor 76 inhibits the flow of current through the transistor so that a high voltage is produced on the gates of the transistors 68 and 70. This high voltage tends to limit the current through the transistor 70 and to produce a low voltage on the drain of the transistor.

The low voltage on the gate of the transistor 68 also tends to limit the current through the transistor 68 and to produce a low voltage on the drains of the transistors 64 and 72. This low voltage is opposite to the high voltage produced on the drain of the transistor 64 by the flow of current through the transistor as described in the previous paragraph. If the characteristics of the transistors in the amplifier shown in FIG. 6 are chosen properly, the effects on the gate of the transistor 64 by the operation of the transistors 64 and 68 will tend to cancel each other so that little, if any, signal current will flow through the transistor 64. This will cause the impedance on the node (Vout⁻) in FIG. 6 to approach infinity. In like manner, the transistors 66 and 70 will operate in conjunction so that little, if any, current will flow through the transistor 70. This will cause the impedance on the node Vout⁻ to approach infinity.

The production of an impedance approaching infinity on the node Vout⁻ may be seen in part from the fact that the transistors 64 and 70 have positive impedances and these impedances are low. However, the transistors 66 and 68 have negative impedances because of the connection between the drain of each of these transistors and the gate of the other of these transistors. The impedances in the transistors 64 and 66 cancel each other as do the impedances in the transistors 68 and 70. Such cancellations produce high impedances at the Vout terminals in FIG. 6.

Figure 7A:
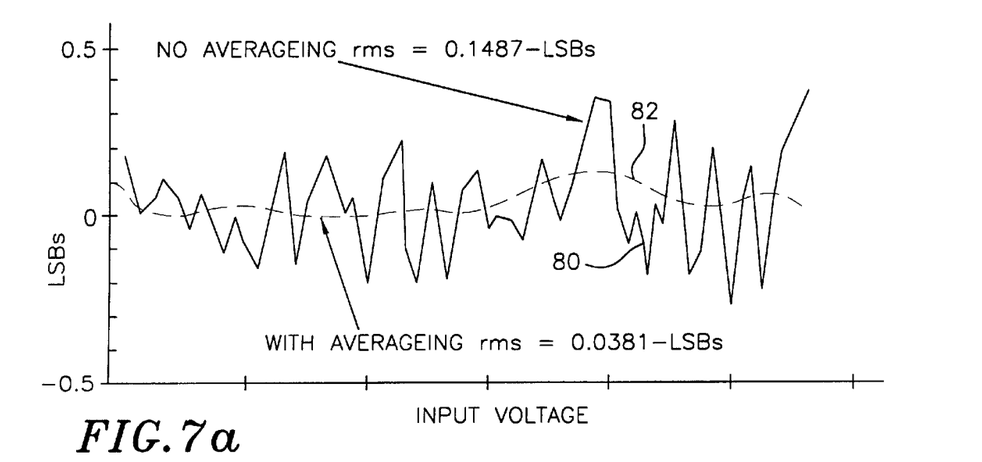
FIG. 7a shows curves of integral non-linearity with and without the features of applicant's invention and illustrates the considerable decrease in integral non-linearity produced by applicant's invention.

FIG. 7a shows an envelope 80 (in solid lines) of integral non-linearity for the prior art embodiment shown in FIG. 1 and also shows an envelope 82 (in broken lines) of integral non-linearity for the embodiment shown in FIG. 5. In FIG. 7a, the input voltage is shown on the horizontal axis and the integral non-linearity is shown on the vertical axis for the value of the least significant bit. The envelopes are shown for cells or stages averaging over sixteen (16). As will be seen from the envelope 82, the integral non-linearity may vary from stage to stage by as much as approximately one half of the value of the least significant bit. However, when the embodiment of the invention shown in FIG. 5 is used, the variations in the integral non-linearity in the successive cells or stages, as seen by the envelope 82, is relatively minor. As will be seen from FIG. 7a and from the subsequent discussion, the gain improvement in integral non-linearity in the curve 82 relative to the curve 80 is approximately 3.9. This corresponds to approximately 1.96 bits.

Figure 7B:
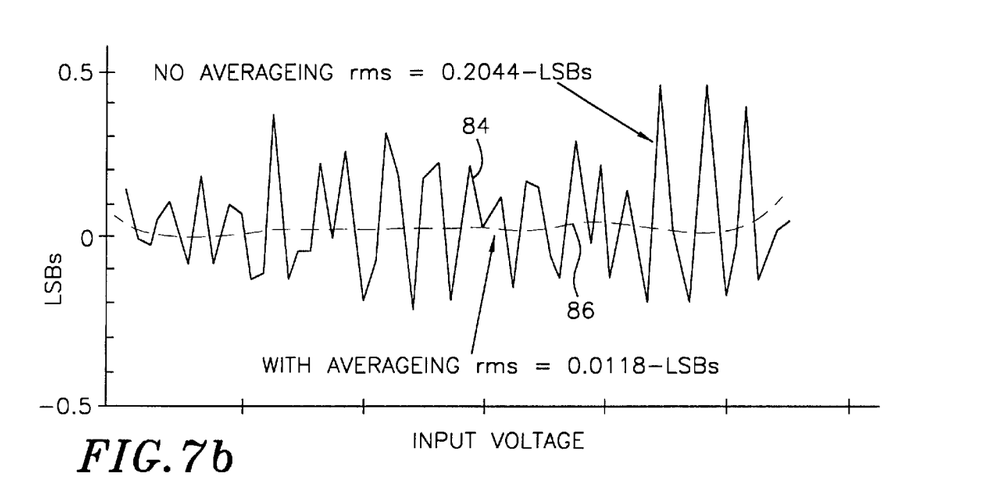
FIG. 7b shows curves of differential non-linearity with and without the features of applicant's invention and illustrates the considerable decrease in differential non-linearity produced by applicant's invention.

FIG. 7b shows an envelope 84 (in solid lines) of differential non-linearity for the prior art embodiment shown in FIG. 1 and also shows an envelope 86 of differential non-linearity for the embodiment shown in FIG. 5. In FIG. 7b, the input voltage is shown on the horizontal axis and the differential non-linearity is shown on the vertical axis for the value of the least significant bit. The envelopes 84 and 86 are shown for cells or stages averaging over sixteen (16).

As will be seen from the envelope 84, the differential linearity for the prior art (FIG. 2) may vary from stage to stage by values approaching the value of the least significant bit. However, when the embodiment of the invention shown in FIG. 5 is used, the variations in the differential non-linearity in the successive stages, as seen from the envelope 86 (in broken lines), is relatively minor. As will be seen from FIG. 7b and from the subsequent discussion, the gain in the curve 86 relative to the curve 84 is approximately 17.3. This corresponds to approximately 4.1 bits.

Figure 8:
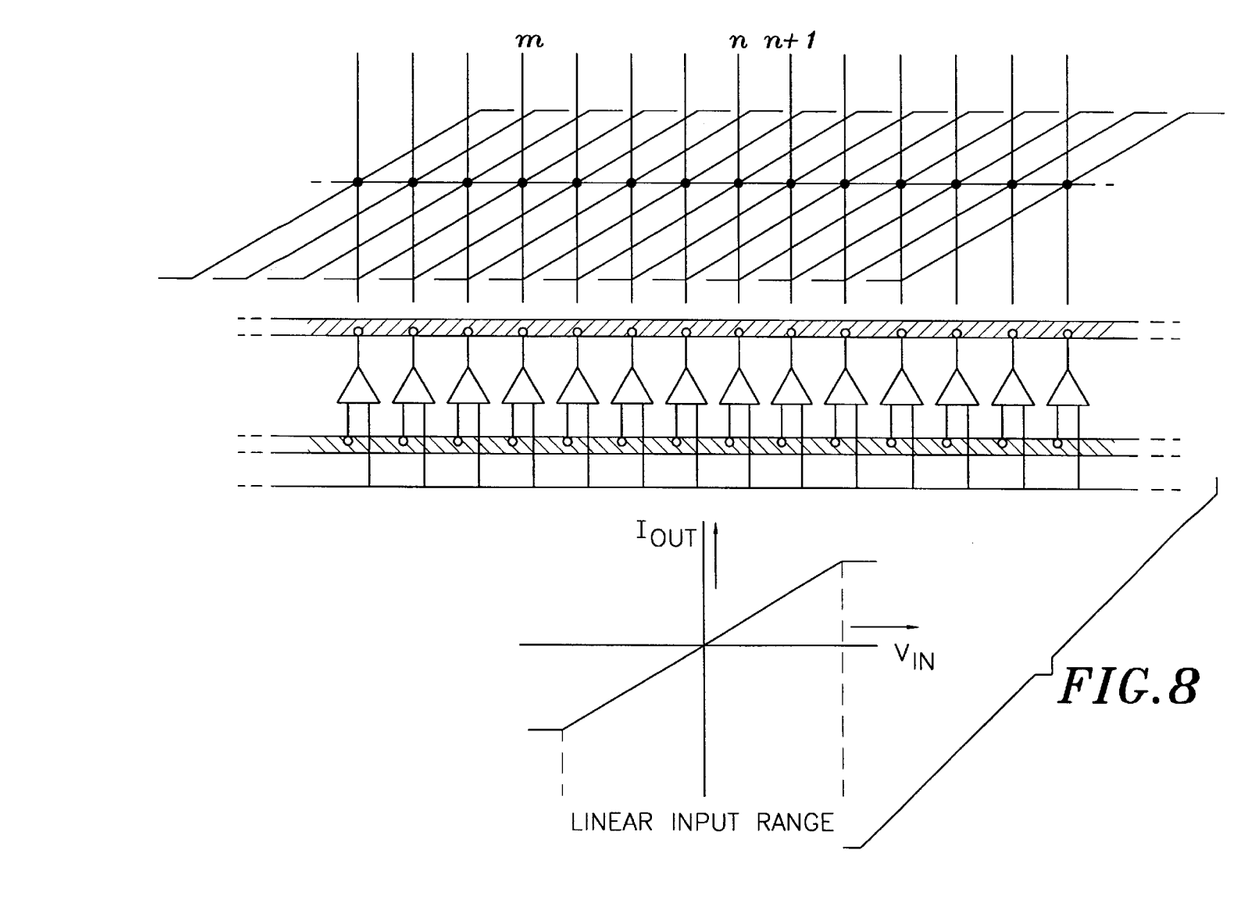
FIG. 8 is a diagram schematically illustrating the input ranges of individual cells in the circuitry shown in FIG. 5 as a result of the inclusion of the features of applicant's invention.

The improvements in integral non-linearity and differential non-linearity due to averaging can be understood by considering the diagram of FIG. 8, where the ladder and averaging resistors are shown as one contiguous strip of resistive material. The linear input range of each amplifier stage is shown at the top of the diagram. When the input signal is centered around amplifier m, the current in the averaging resistor contains linear contributions from adjacent amplifiers as well. Beyond the linear range of the amplifiers, the current is clipped. In this example, the linear input range overlaps 5 amplifiers. Therefore the root mean square (rms) offset voltage at stage m is reduced according to $$v_{\sigma m} = \frac{v_\sigma}{\sqrt{5}} \quad (1)$$

In general the offset after averaging is reduced by $\sqrt{N}$, where N is the number of amplifier stages operating in the linear input range at any one instant.

The improvement in differential non-linearity is even larger because it is obtained by taking the difference of two output voltages which, after averaging, are highly correlated. Consider the stages n and n+1 in FIG. 8. Without averaging $$v_\delta = v_n - v_{n+1} \quad (2)$$

and the rms value of differential non-linearity is simply $$v_{\delta\sigma} v_G \sqrt{2}$$

After averaging, $$v_\delta = \frac{v_{n-2} + v_{n-1} + v_n + v_{n+1} + v_{n+2}}{5} - \quad (3)$$

$$\frac{v_{n-1} + v_n + v_{n+1} + v_{n+2} + v_{n+3}}{5} \frac{v_{n-2} - v_{n+3}}{5}$$

and the rms value of the difference in offset voltage is given by $$v_{\delta\sigma} = v_\sigma \frac{\sqrt{2}}{5}$$

Therefore, differential non-linearity is reduced by the factor N. Returning to the simulation of FIG. 7, where N=16, the improvement of 3.9(1.96-bits) in integral non-linearity and 17.3 (4.1-bits) in differential non-linearity is consistent with this analysis. The gain of 3 (1.5-bits, 9.5-dB) in differential non-linearity reported in the prior art (technique for Reducing Differential Non-Linearity Errors in Flash A/D Converters by Kevin Kattman and Jeff Barrow at pages 170–175 of the 1991 Digest of Technical Papers in the International Sold State Circuits Conference) implies an averaging over N=3 stages. This analysis would predict a corresponding gain of 1.73(0.8-bits, 4.7-dB) in integral non-linearity, which would reduce maximum harmonics by a similar factor. This was indeed found to be the case and a reduction of 5–6.6-dB was reported in the prior art.

For the actual design, applicant used folding and interpolation, which complicates the above first-order analysis, but the principle, and obtainable integral non-linearity and differential non-linearity gains remain the same. This distributed approach has the effect of making the input transistors look bigger. To achieve the same differential non-linearity performance without averaging, the input transistors would have to increase in area by $N^2$, or 256 times for N=16. Such enormous gains in differential non-linearity and integral non-linearity from averaging allows the use of almost minimum size devices in the gain stages.

Figure 9:
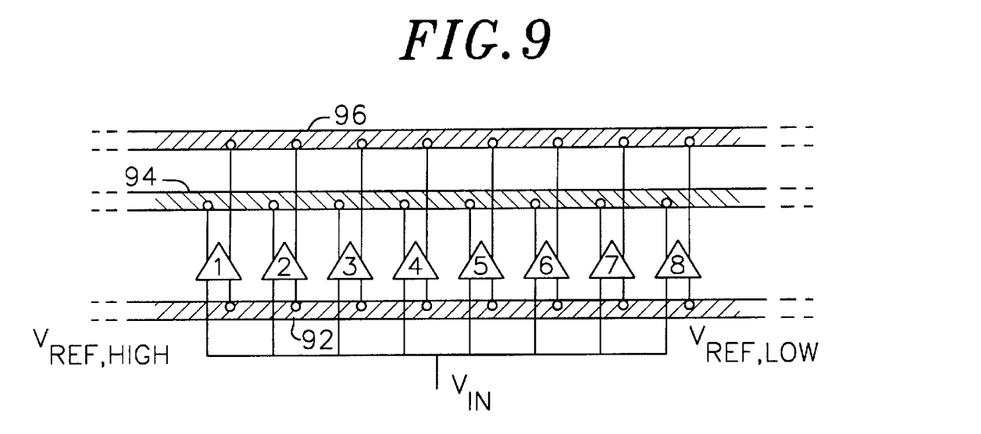
FIG. 9 illustrates an embodiment included in this invention for replacing the impedances in the system of FIG. 5 by strips of resistive material deposited on an integrated circuit chip.
Figure 12:
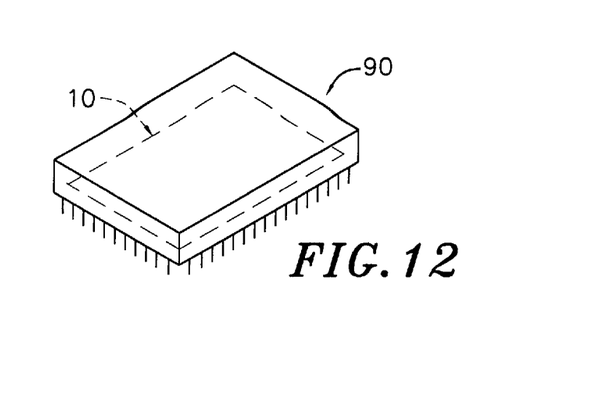
FIG. 12 is a schematic illustration of an integrated circuit chip on which an individual one of the embodiments shown in FIGS. 5, 6, 9, 10 and 11 may be deposited.

FIG. 9 shows an arrangement corresponding to that shown in FIG. 5. This embodiment shows eight (8) cells respectively designated as "1" through "8". Each of the cells 1–8 is considered to be constructed in a manner corresponding to that shown in FIGS. 5 and 6. However, in the embodiment shown in FIG. 9, the resistors 18a, 18b, 18c and 18d are replaced by a strip 92 of resistive material deposited on an integrated circuit chip 90 (FIG. 12) holding the circuitry shown in FIG. 5. As will be seen, the resistive strip 92 is disposed in a direction transverse to the cells, which are designated as 1–8 in FIG. 9. The resistive strip 92 is tapped at progressive positions to form the resistors 18a, 18b, 18c and 18d.

In like manner, the resistors corresponding to the resistor 60a in FIG. 5 are formed by a strip 94 of resistive material deposited on the integrated circuit chip 90. The resistive strip 94 is disposed in a direction substantially parallel to, but displaced from, the resistive strip 92. The resistive strip 94 is tapped at progressive positions to form such resistors. The resistors corresponding to the resistor 62a in FIG. 5 are also formed by a strip 96 of resistive material deposited on the integrated circuit 90. The resistive strip 96 is substantially parallel to, but displaced from, the resistive strips 92 and 94. The resistive strip 96 is tapped at progressive positions to form such resistors.

In the embodiments shown in FIGS. 5 and 9 and in the prior art embodiments shown in FIGS. 2 and 4, the averaging resistors have open-ended terminations at their opposite ends. For example, the resistive strips 94 and 96 have open-ended terminations. This may be seen from the fact that these cells cannot provide averaging impedances such as the impedances 60a and 60b in FIG. 5 to reduce the effects of such cell mismatches. It will also be appreciated that the effects of mismatches in the cells immediately adjacent to the extreme left and extreme right cells also cannot be completely compensated because the effects of these cell mismatches cannot be averaged over a sufficient number of cells.

Figure 10:
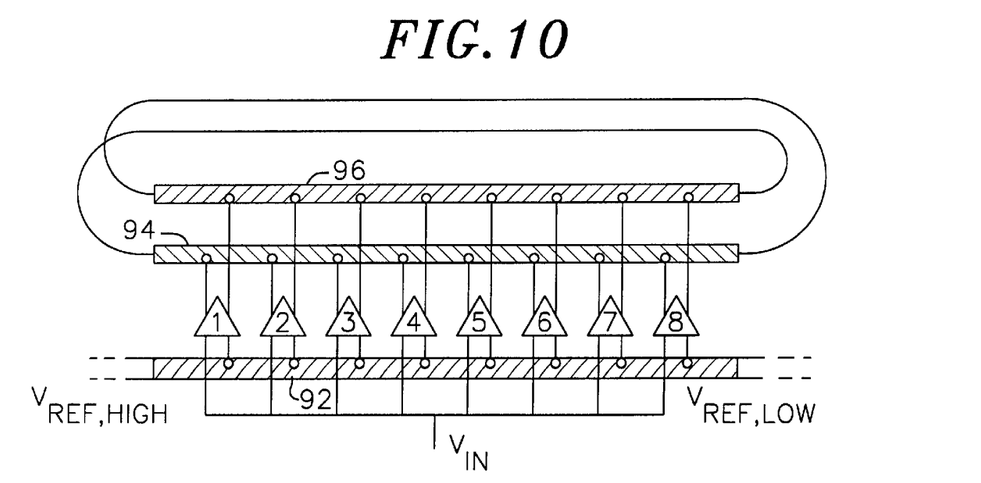
FIG. 10 illustrates an additional embodiment of the invention wherein cross connections are provided between the resistive strips defining the averaging resistors shown in FIG. 9 to minimize the effects of open-end terminations of these resistive strips as shown in FIG. 9.

FIG. 10 shows an embodiment in which effective compensations are provided even at the positions of the open end terminations of the averaging resistors. This is accomplished by connecting the right open end of each of the sets of averaging impedances to the left open end of the other set of averaging resistors. For example, the open-ended terminal in the averaging impedance 60a (FIG. 5) in one set is connected to the open-ended terminal in the averaging resistor at the right end of the set including the averaging impedance 62a. In like manner, the open-ended terminal in the averaging impedance 62a (FIG. 5) in the second set is connected to the open ended terminal at the right end of the set including the averaging impedance 60a.

Figure 11:
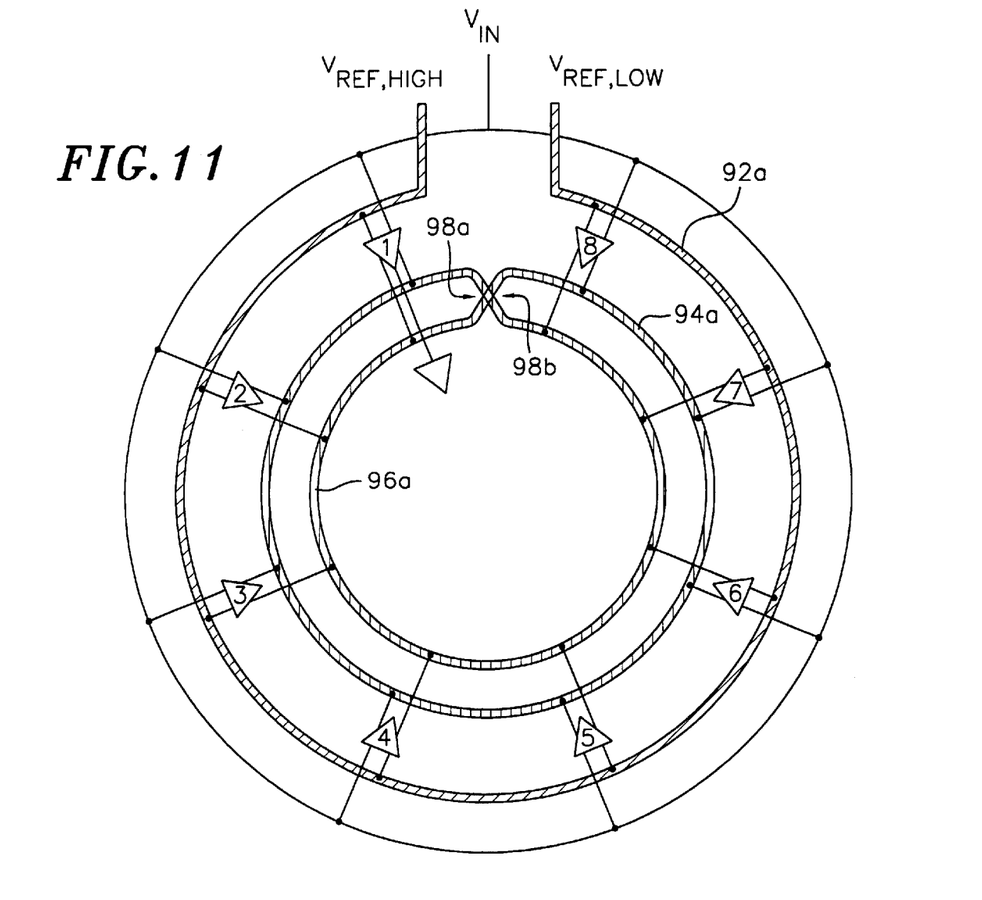
FIG. 11 shows an embodiment equivalent to that shown in FIG. 10 but illustrates with increased clarity the advantages of the embodiment shown in FIG. 10.

FIG. 11 shows a re-arrangement of the different elements in the embodiment shown in FIG. 10 to show the symmetry of the arrangement of FIG. 10. As will be seen, the straight line arrangement in FIG. 10 is re-arranged into a circle in the embodiment shown in FIG. 11. The different strips of resistors in FIG. 11 are respectively designated as 92a, 94a and 96a to correspond to the resistive strips 92, 94 and 96 in FIG. 9. In the embodiment shown in FIG. 11, one open-end of each of the strips 94a and 96b are connected to the other open end of the other strip. This results in crossovers 98a and 98b. The crossovers 98a and 98b are electrically insulated from each other.

The embodiments of the invention shown in the drawings and described above have certain advantages over the prior art, particularly the prior art shown in FIGS. 2 and 4. The embodiments of the invention compensate for cell mismatches with much greater effect than in the prior art. This may be seen from the considerable decrease in integral non-linearity and differential non-linearity by the embodiments of this invention relative to the systems of the prior art. This results in part from the passage of all of the load current through the averaging impedances in the embodiments of this invention. The passage of all of the signal current through the averaging impedances results from the inclusion in the cells of impedances having values approaching infinity.

The embodiments of this invention are also advantageous in minimizing the effects of cell mismatches in the averaging impedances having open ended terminations in the prior art. In the embodiments of this invention, the open ended terminations at each end in each set of averaging impedances are connected to the open ended terminations at the opposite end of the other set of averaging impedances. For example, the impedance 60a at the left end of the set including the impedance 60a is connected to the impedance at the right end of the set including the impedance 62a.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

What is claimed is:

1. An integrated circuit comprising:
   a plurality of cells, each cell having a pair of input terminals for respectively receiving an input signal and a voltage reference, each said cell also including a pair of output terminals for providing a differential output signal;
   a plurality of high impedance current sources connected to the respective output terminals of the cells; and
   a plurality of impedance elements connected across corresponding output terminals of adjacent cells.

2. The integrated circuit of claim 1, wherein each cell comprises a differential transistor pair, the differential pair having a first input coupled to an input signal, a second input coupled to a voltage reference, first and second output terminals, and commonly connected third terminals, the differential pair developing an output signal on the first and second output terminals, characterized by a difference between the input signal and the reference voltage.

3. The integrated circuit of claim 2, wherein each cell further includes an additional current source that is coupled between a low potential and the commonly connected third terminals of the differential pair.

4. The integrated circuit of claim 1, wherein the high impedance current sources are interposed between a high potential and the output terminals of the respective cells.

5. The integrated circuit of claim 1, wherein the high impedance current source comprises first and second pairs of transistors, each including a first terminal connected to a voltage source, and wherein respective second terminals of each pair of transistors are connected to a third terminal of one of the transistors in the other pair.

6. The integrated circuit of claim 5, wherein the high impedance current source comprises first and second voltage compensation circuits, with the first voltage compensation circuit developing a low-going voltage swing on the third terminal of the second transistor pair in response to the difference between the input signal and the reference voltage being in a first direction, the second voltage compensation circuit developing a high-going voltage swing on the third terminal of the first transistor pair in response to the difference between the input signal and the reference voltage being in a first direction, the high-going voltage swing compensating the low-going voltage swing such that the voltage on the first drain node remains substantially constant.

7. The integrated circuit of claim 6, wherein the first and second voltage compensation circuits each comprises first and second transistors, each having source terminals coupled in common to a high potential, and having respective gate terminals tied in common, each first transistor having its drain terminal coupled to the common gate terminal; and
   wherein each second transistor includes a drain terminal coupled to the drain terminal of the first transistor of the opposite voltage compensation circuit.

8. The integrated circuit of claim 7, wherein the drain node of each first transistor of the first and second voltage compensation circuits is coupled in series fashion to the respective first and second output terminals of the cell.

9. The integrated circuit of claim 1, wherein the impedance elements are connected across the respective cells so as to provide current between the respective cells.

10. The integrated circuit of claim 1, wherein the impedance values of the impedance elements are substantially the same.

11. The integrated circuit of claim 1, wherein the impedance elements comprise resistors.

12. The integrated circuit of claim 1, wherein the impedance elements are arranged to have closed ended terminations.

13. A method of reducing mismatch between adjacent cells in an integrated circuit, comprising:
applying input and reference voltages to respective cell inputs to generate a differential output; and
forcing substantially all of the differential output current through respective impedance elements coupled between corresponding output terminals in adjacent cells.

14. The method of claim 13, wherein forcing the output current comprises including plural high impedance current sources that are connected to the respective output terminals.

15. The method of claim 13, wherein forcing the output current through the impedance elements comprises passing the current through respective resistors.

16. The method of claim 15, wherein the resistors are arranged in two sets whose ends are connected together.

17. The method of claim 13, wherein applying the input and reference voltages comprises applying those signals to respective input terminals of a differential pair of transistors.

* * * * *